(12) United States Patent
Kitamura

(10) Patent No.: US 10,048,094 B2
(45) Date of Patent: Aug. 14, 2018

(54) ENCODER

(71) Applicant: Murata Manufacturing Co., Ltd., Nagaokakyo-shi, Kyoto-fu (JP)

(72) Inventor: Akihiro Kitamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/785,456

(22) Filed: Oct. 17, 2017

(65) Prior Publication Data

US 2018/0038713 A1 Feb. 8, 2018

Related U.S. Application Data

(63) Continuation of application No. PCT/JP2016/062029, filed on Apr. 14, 2016.

(30) Foreign Application Priority Data

Apr. 21, 2015 (JP) .................. 2015-086708
Dec. 18, 2015 (JP) .................. 2015-247285

(51) Int. Cl.
*G01R 27/08* (2006.01)
*G01D 5/165* (2006.01)
(Continued)

(52) U.S. Cl.
CPC .............. *G01D 5/165* (2013.01); *G01R 1/00* (2013.01); *G05B 2219/00* (2013.01); *G06F 1/00* (2013.01); *H02J 1/00* (2013.01); *H02K 2201/00* (2013.01)

(58) Field of Classification Search
CPC .......... H02J 1/00; G06F 1/00; G06F 2101/00; G09G 1/00; G09G 2230/00; B60R 1/00;
(Continued)

(56) References Cited

U.S. PATENT DOCUMENTS 4,466,189 A * 8/1984 Tobin, Jr. ............... G01C 1/00
250/231.14
2004/0041086 A1 3/2004 Imamura
(Continued)

FOREIGN PATENT DOCUMENTS

JP 08-313306 A 11/1996
JP 2004-095242 A 3/2004

OTHER PUBLICATIONS

Official Communication issued in International Patent Application No. PCT/JP2016/062029, dated May 24, 2016.

*Primary Examiner* — Jermele M Hollington
*Assistant Examiner* — Temilade Rhodes-Vivour
(74) *Attorney, Agent, or Firm* — Keating & Bennett, LLP

(57) ABSTRACT

An encoder includes an encoder circuit including first and second switches, a first resistor connected in series to the first switch, and a second resistor connected in series to the second switch, the encoder circuit defined by the first switch and the first resistor and the second switch and the second resistor being connected between a power supply voltage and a ground, and a control circuit connected between the first and second resistors and the power supply voltage to turn off power supply from the power supply voltage to the first resistor when the first switch is closed and to turn off power supply from the power supply voltage to the second resistor when the second switch is closed. The control circuit is connected to a first connection point between the first resistor and the first switch and to a second connection point between the second resistor and the second switch.

15 Claims, 11 Drawing Sheets

(51) Int. Cl.
　　　*G01R 1/00*　　　(2006.01)
　　　*H02J 1/00*　　　(2006.01)
　　　*G06F 1/00*　　　(2006.01)

(58) Field of Classification Search
　　　CPC .. B60R 2225/00; G05B 1/00; G05B 2219/00;
　　　　　　G05F 1/00; H02K 1/00; H02K 2201/00;
　　　　　　G01C 1/00; G01D 1/00; G01L 1/00;
　　　　　　G01R 1/00
　　　See application file for complete search history.

(56) References Cited

U.S. PATENT DOCUMENTS

| | | | | |
|---|---|---|---|---|
| 2005/0104749 | A1* | 5/2005 | Tokue | H03M 1/1076 |
| | | | | 341/13 |
| 2012/0179413 | A1* | 7/2012 | Hasse | G01D 1/00 |
| | | | | 702/122 |
| 2015/0040687 | A1* | 2/2015 | Ariyama | G01R 33/07 |
| | | | | 73/862.381 |

* cited by examiner

*Fig.6*

| Sw1 | Sw2 | Qs1 | Qs2 | Qm |
|---|---|---|---|---|
| OPENED | OPENED | ON | ON | ON |
| CLOSED | OPENED | OFF | ON | OFF |
| OPENED | CLOSED | ON | OFF | OFF |
| CLOSED | CLOSED | OFF | OFF | OFF |

Fig.7A

| R1,R2 | 100kΩ |
|---|---|
| R3,R8 | 1MΩ |
| R4,R6 | 1 or 2.2 or 5.1 MΩ |
| R5,R7 | 7.5MΩ |
| Cm,Cs1,Cs2 | OPEN |

Fig.7B

| Sw1 | Sw2 | R4,R6 =1MΩ CONSUMPTION CURRENT [µA] | R4,R6 =2.2MΩ CONSUMPTION CURRENT [µA] | R4,R6 =5.1MΩ CONSUMPTION CURRENT [µA] | CONVENTIONAL EXAMPLE CONSUMPTION CURRENT [µA] |
|---|---|---|---|---|---|
| OPENED | OPENED | 5.5 | 5.4 | 5.4 | 0 |
| CLOSED | OPENED | 9.2 | 4.3 | 1.9 | 50 |
| OPENED | CLOSED | 9.2 | 4.3 | 1.9 | 50 |
| CLOSED | CLOSED | 10.0 | 4.5 | 2.0 | 100 |

*Fig.10*

| Sw1 | Sw2 | Qs1 | Qs2 | Qm1 | Qm2 |
|---|---|---|---|---|---|
| OPENED | OPENED | ON | ON | ON | ON |
| CLOSED | OPENED | OFF | ON | OFF | ON |
| OPENED | CLOSED | ON | OFF | ON | OFF |
| CLOSED | CLOSED | OFF | OFF | OFF | OFF |

ENCODER

CROSS REFERENCE TO RELATED APPLICATIONS

This application claims the benefit of priority to Japanese Patent Application No. 2015-086708 filed on Apr. 21, 2015 and Japanese Patent Application No. 2015-247285 filed on Dec. 18, 2015 and is a Continuation Application of PCT Application No. PCT/JP2016/062029 filed on Apr. 14, 2016. The entire contents of each application are hereby incorporated herein by reference.

BACKGROUND OF THE INVENTION

1. Field of the Invention

The present invention relates to an encoder.

2. Description of the Related Art

Conventional encoders include an encoder described in Japanese Laid-Open Patent Publication No. 2004-95242. The encoder has a shaft and an encoder mechanism detecting a rotation direction and a rotation amount of the shaft.

The encoder mechanism has a rotor attached to the shaft, first and second sliders attached to the rotor, and a ring-shaped comb electrode pattern in sliding contact with the first and second sliders. When the shaft rotates, the first slider intermittently comes into contact with the ring-shaped comb electrode pattern and the second slider intermittently comes into contact with the ring-shaped comb electrode pattern.

FIG. 11 is an equivalent circuit diagram of the encoder mechanism. As shown in FIG. 11, an encoder circuit 100 includes first and second switches Sw1, Sw2 opening and closing in accordance with the rotation of the shaft (slider), a first resistor R1 connected in series to the first switch Sw1, and a second resistor R2 connected in series to the second switch Sw2.

The first switch Sw1 and the first resistor R1 as well as the second switch Sw2 and the second resistor R2 are connected in parallel between a power supply voltage Vcc and a ground GND. The first resistor R1 and the second resistor R2 are located on the power supply voltage Vcc side.

The first switch Sw1 includes a first slider and a ring-shaped comb electrode pattern, and the first slider comes into contact with the ring-shaped comb electrode pattern to put the first switch Sw1 into a closed state. Similarly, the second switch Sw2 includes a second slider and a ring-shaped comb electrode pattern.

The opening and closing of the first switch Sw1 can be determined by detecting an output of a point A between the first switch Sw1 and the first resistor R1 and an output of a point C between the encoder circuit 100 and the ground GND. Similarly, the opening and closing of the second switch Sw2 can be determined by detecting an output of a point B between the second switch Sw2 and the second resistor R2 and the output of the point C between the encoder circuit 100 and the ground GND. By determining the opening and closing of the first and second switches Sw1, Sw2, the rotation direction and the rotation amount of the shaft are detected.

In the conventional encoder, for example, when at least one of the first and second switches Sw1, Sw2 is closed during standby until a certain time elapses after detection of the output of the encoder circuit 100, a current flows though the encoder circuit 100. The inventor of the present invention newly focused attention on the fact that this current is wasted electric power consumed by the encoder circuit 100.

For example, it is assumed that the first and second resistors R1, R2 are set to 100 kΩ and that the power supply voltage Vcc is set to 5 V. When one of the first and second switches Sw1, Sw2 is closed, the power consumption is 250 μW. When both the first and second switches Sw1, Sw2 are closed, the power consumption is 500 μW.

SUMMARY OF THE INVENTION

Preferred embodiments of the present invention provide encoders that are capable of reducing the electric power consumed between the power supply voltage and the ground when at least one of the first and second switches is closed.

An encoder according to a preferred embodiment of the present invention is an encoder detecting a movement direction and a movement amount of a second member movable with respect to a first member that includes an encoder circuit including first and second switches opening and closing in accordance with the movement of the second member, a first resistor connected in series to the first switch, and a second resistor connected in series to the second switch, the encoder circuit is defined by the first switch and the first resistor and the second switch and the second resistor connected between a power supply voltage and a ground such that the first and second resistors are located on the power supply voltage side, and a control circuit connected between the first and second resistors and the power supply voltage to turn off power supply from the power supply voltage to the first resistor when the first switch is closed and to turn off power supply from the power supply voltage to the second resistor when the second switch is closed. The control circuit is connected to a first connection point between the first resistor and the first switch and is connected to a second connection point between the second resistor and the second switch to always energize the first and second connection points from the power supply voltage.

In an encoder according to a preferred embodiment of the present invention, the control circuit is connected between the first and second resistors and the power supply voltage to turn off the power supply from the power supply voltage to the first resistor when the first switch is closed, and is connected between the second resistor and the power supply voltage to turn off the power supply from the power supply voltage to the second resistor when the second switch is closed. As a result, when the first switch is closed, no current is applied to the first resistor, so that no electric power is consumed by the first resistor. When the second switch is closed, no current is applied to the second resistor, so that no electric power is consumed by the second resistor.

The control circuit is connected between the first connection point, which is between the first resistor and the first switch, and the power supply voltage and is connected between the second connection point, which is between the second resistor and the second switch, and the power supply voltage, so as to always energize the first and second connection points from the power supply voltage. As a result, the outputs of the first and second switches are detected to determine the opening and closing of the first and second switches. By determining the opening and closing of the first and second switches, the movement direction and the movement amount of the second member are detected.

Therefore, the encoder satisfies the function as an encoder and reduces the electric power consumed between the power supply voltage and the ground when at least one of the first and second switches is closed.

In an encoder according to a preferred embodiment of the present invention, the encoder circuit is defined by the first switch and the first resistor and the second switch and the second resistor connected in parallel between the power supply voltage and the ground, and the control circuit turns off power supply from the power supply voltage to the first and second resistors when at least one of the first and second switches is closed.

In the encoder according to this preferred embodiment of the present invention, the control circuit turns off the power supply from the power supply voltage to the first and second resistors when at least one of the first and second switches is closed. As a result, when at least one of first and second switches is closed, no current is applied to the first and second resistors, so that no electric power is consumed by the first and second resistors.

In an encoder according to a preferred embodiment of the present invention, the control circuit includes a pnp-type main transistor including an emitter connected to the power supply voltage, a collector connected to the encoder circuit, and a base connected to the power supply voltage, and a main transistor control circuit connected to the base of the main transistor and applying no current between the emitter and the base of the main transistor so as not to apply a current between the emitter and the collector of the main transistor when at least one of the first and second switches is closed.

In the encoder of this preferred embodiment, the control circuit includes the pnp-type main transistor and the main transistor control circuit connected to the base of the main transistor to control a base current. Therefore, the control circuit has a simple configuration.

In an encoder according to a preferred embodiment of the present invention, the main transistor control circuit includes an npn-type first sub-transistor including a collector connected via a third resistor to the base of the main transistor and a base connected via a series circuit of a fourth resistor and a fifth resistor to the power supply voltage, and an npn-type second sub-transistor including a collector connected to the emitter of the first sub-transistor, an emitter connected to the ground, and a base connected via a series circuit of a sixth resistor and a seventh resistor to the power supply voltage, and the first connection point of the encoder circuit is connected between the fourth resistor and the fifth resistor while the second connection point of the encoder circuit is connected between the sixth resistor and the seventh resistor.

In the encoder of this preferred embodiment, the main transistor control circuit includes the npn-type first sub-transistor and the npn-type second sub-transistor. Therefore, the main transistor control circuit has a simple configuration.

In an encoder according to a preferred embodiment of the present invention, an eighth resistor is connected between the base of the main transistor and the power supply voltage.

In the encoder of this preferred embodiment, since the eighth resistor is connected between the base of the main transistor and the power supply voltage, the noise of the base of the main transistor is removed.

In an encoder according to a preferred embodiment of the present invention, a capacitor is connected to at least one of the base of the main transistor, the base of the first sub-transistor, and the base of the second sub-transistor.

In the encoder of this preferred embodiment, since the capacitor is connected to at least one of the base of the main transistor, the base of the first sub-transistor, and the base of the second sub-transistor, the base current is stabilized.

In an encoder according to a preferred embodiment of the present invention, the control circuit includes a pnp-type first main transistor including an emitter connected to the power supply voltage, a collector connected to the first resistor of the encoder circuit, and a base connected to the power supply voltage, a pnp-type second main transistor including an emitter connected to the power supply voltage, a collector connected to the second resistor of the encoder circuit, and a base connected to the power supply voltage, a first main transistor control circuit connected to the base of the first main transistor and applying no current between the emitter and the base of the first main transistor so as not to apply a current between the emitter and the collector of the first main transistor when the first switch is closed, and a second main transistor control circuit connected to the base of the second main transistor and applying no current between the emitter and the base of the second main transistor so as not to apply a current between the emitter and the collector of the second main transistor when the second switch is closed.

In the encoder of this preferred embodiment, the control circuit includes the pnp-type first and second main transistors and the first and second main transistor control circuits connected to the bases of the first and second main transistors to control the base current. Therefore, the control circuit has a simple configuration.

In an encoder according to a preferred embodiment of the present invention, the first main transistor control circuit includes an npn-type first sub-transistor including a collector connected via a third resistor to the base of the first main transistor, an emitter connected to the ground, and a base connected via a series circuit of a fourth resistor and a fifth resistor to the power supply voltage, the second main transistor control circuit includes an npn-type second sub-transistor including a collector connected via a ninth resistor to the base of the second main transistor, an emitter connected to the ground, and a base connected via a series circuit of a sixth resistor and a seventh resistor to the power supply voltage, and the first connection point of the encoder circuit is connected between the fourth resistor and the fifth resistor while the second connection point of the encoder circuit is connected between the sixth resistor and the seventh resistor.

In the encoder of this preferred embodiment, the main transistor control circuit includes the npn-type first sub-transistor and the npn-type second sub-transistor. Therefore, the main transistor control circuit has a simple configuration.

In an encoder according to a preferred embodiment of the present invention, an eighth resistor is connected between the base of the first main transistor and the power supply voltage, and a tenth resistor is connected between the base of the second main transistor and the power supply voltage.

In the encoder of this preferred embodiment, since the eighth resistor is connected between the base of the first main transistor and the power supply voltage, the noise of the base of the first main transistor is removed. Since the tenth resistor is connected between the base of the second main transistor and the power supply voltage, the noise of the base of the second main transistor is removed.

In an encoder according to a preferred embodiment of the present invention, a capacitor is connected to at least one of the base of the first sub-transistor and the base of the second sub-transistor.

In the encoder of this preferred embodiment, since the capacitor is connected to at least one of the base of the first sub-transistor and the base of the second sub-transistor, the base current is stabilized.

In encoders according to various preferred embodiments of the present invention, the electric power consumed between the power supply voltage and the ground is reduced when at least one of the first and second switches is closed.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a table for explaining an operation of a control circuit.

FIG. 7A is a table for explaining a present example.

FIG. 7B is a table for explaining a consumption current of the present example and a consumption current of a conventional example.

FIG. 10 is a table for explaining an operation of a control circuit.

DETAILED DESCRIPTION OF THE PREFERRED EMBODIMENTS

First Preferred Embodiment

Figure 1:
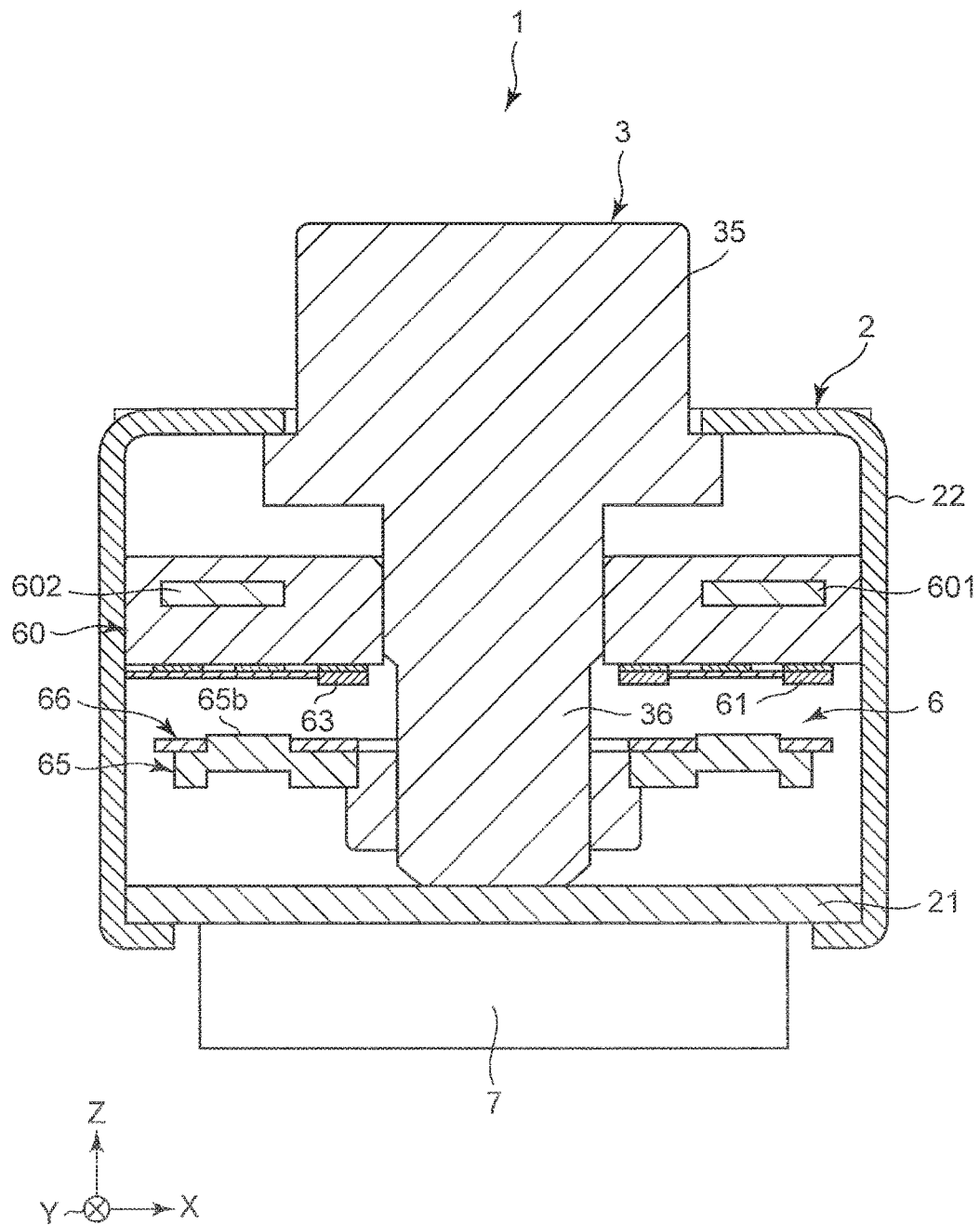
FIG. 1 is a cross-sectional view of an encoder of a first preferred embodiment of the present invention.

FIG. 1 is a cross-sectional view of an encoder of a first preferred embodiment of the present invention. A width direction of the encoder is defined as an X direction and a length direction of the encoder is defined as a Y direction. A height direction of the encoder is defined as a Z direction. It is assumed that the positive side of the Z direction is on the upper side while the negative side of the Z direction is on the lower side.

As shown in FIG. 1, an encoder 1 is a rotary encoder. The encoder 1 includes a casing 2, a shaft 3 attached to the casing 2 so as to be rotatable around an axis, an encoder mechanism 6 detecting a rotation direction and a rotation angle (rotation amount) of the shaft 3, and a control apparatus 7 controlling the encoder mechanism 6.

The casing 2 is preferably made of metal, for example. The casing 2 integrally assembles the shaft 3, the encoder mechanism 6, and the control apparatus 7. The casing 2 includes a bottom wall 21 and a box-shaped lid body 22 attached to the bottom wall 21.

The shaft 3 is preferably made of resin, for example. The shaft 3 includes an operation portion 35 and a shaft portion 36. The operation portion 35 and the shaft portion 36 are arranged along the axis in order from the upper side to the lower side. The operation portion 35 penetrates the lid body 22 of the casing 2, and a user can operate the operation portion 35 from the outside of the casing 2.

Figure 2:
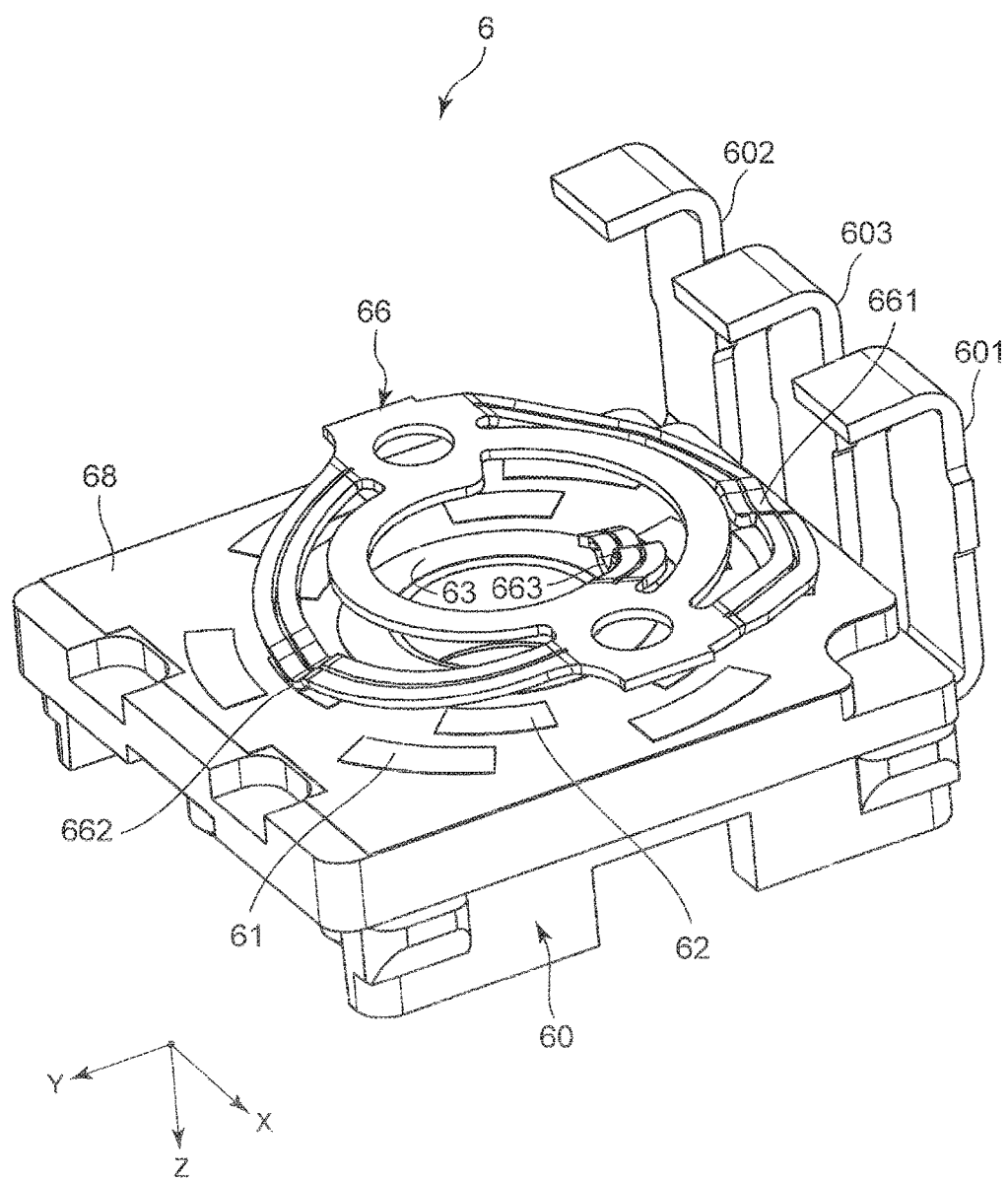
FIG. 2 is a perspective view of an encoder mechanism viewed from the lower side.

FIG. 2 is a perspective view of the encoder mechanism 6 viewed from the lower side. As shown in FIGS. 1 and 2, the encoder mechanism 6 includes an encoder board 60, resistor patterns 61, 62, 63 disposed on the encoder board 60, encoder terminals 601, 602, 603 disposed on the encoder board 60 and electrically connected to the resistor patterns 61, 62, 63, a rotor 65 attached to the shaft 3 so as to be rotatable together with the shaft 3, and a slider 66 attached to the rotor 65 and coming into sliding contact with the resistor patterns 61, 62, 63.

The encoder board 60 is preferably made of resin, for example. The encoder board 60 is disposed in the casing 2 and fixed to the lid body 22 of the casing 2.

The resistor patterns 61, 62, 63 are disposed on a lower surface of the encoder board 60. The resistor patterns 61, 62, 63 are patterns that detect the rotation direction and the rotation angle of the shaft 3. The first resistor pattern 61, the second resistor pattern 62, and the third resistor pattern 63 are annularly disposed and concentrically arranged. The first resistor pattern 61, the second resistive element pattern 62, and the third resistive element pattern 63 are arranged in order from the outside to the inside in the radial direction. The first resistor pattern 61 and the second resistor pattern 62 are each intermittently disposed. The third resistor pattern 63 is continuously provided.

The encoder terminals 601, 602, 603 preferably are insert-molded in the encoder board 60. The first encoder terminal 601 is electrically connected to the first resistor pattern 61, the second encoder terminal 602 is electrically connected to the second resistor pattern 62, and the third encoder terminal 603 is electrically connected to the third resistor pattern 63.

The rotor 65 is fixed to the shaft 3. The rotor 65 is disposed on the lower side of the encoder board 60.

The slider 66 is preferably made of metal, for example. The slider 66 is fixed to two projecting portions 65b on an upper surface of the rotor 65. The slider 66 has an annular or substantially annular configuration. The slider 66 includes a first contact portion 661, a second contact portion 662, and a third contact portion 663. The first contact portion 661, the second contact portion 662, and the third contact portion 663 are arranged in order from the outside to the inside in the radial direction. The first contact portion 661, the second contact portion 662, and the third contact portion 663 are conductive.

The first contact portion 661 is located at a position corresponding to the first resistor pattern 61, the second contact portion 662 is located at a position corresponding to the second resistor pattern 62, and the third contact portion 663 is located at a position corresponding to the third resistor pattern 63. As the slider 66 rotates, the first contact portion 661 intermittently comes into contact with the first resistor pattern 61 and the second contact portion 662 intermittently comes into contact with the second resistor pattern 62. The third contact portion 663 is always in contact with the third resistor pattern 63. Therefore, as the slider 66 rotates, the first encoder terminal 601 and the third encoder terminal 603 are intermittently brought into electric connect, and the second encoder terminal 602 and the third encoder terminal 603 are intermittently brought into electric connect.

Figure 3:
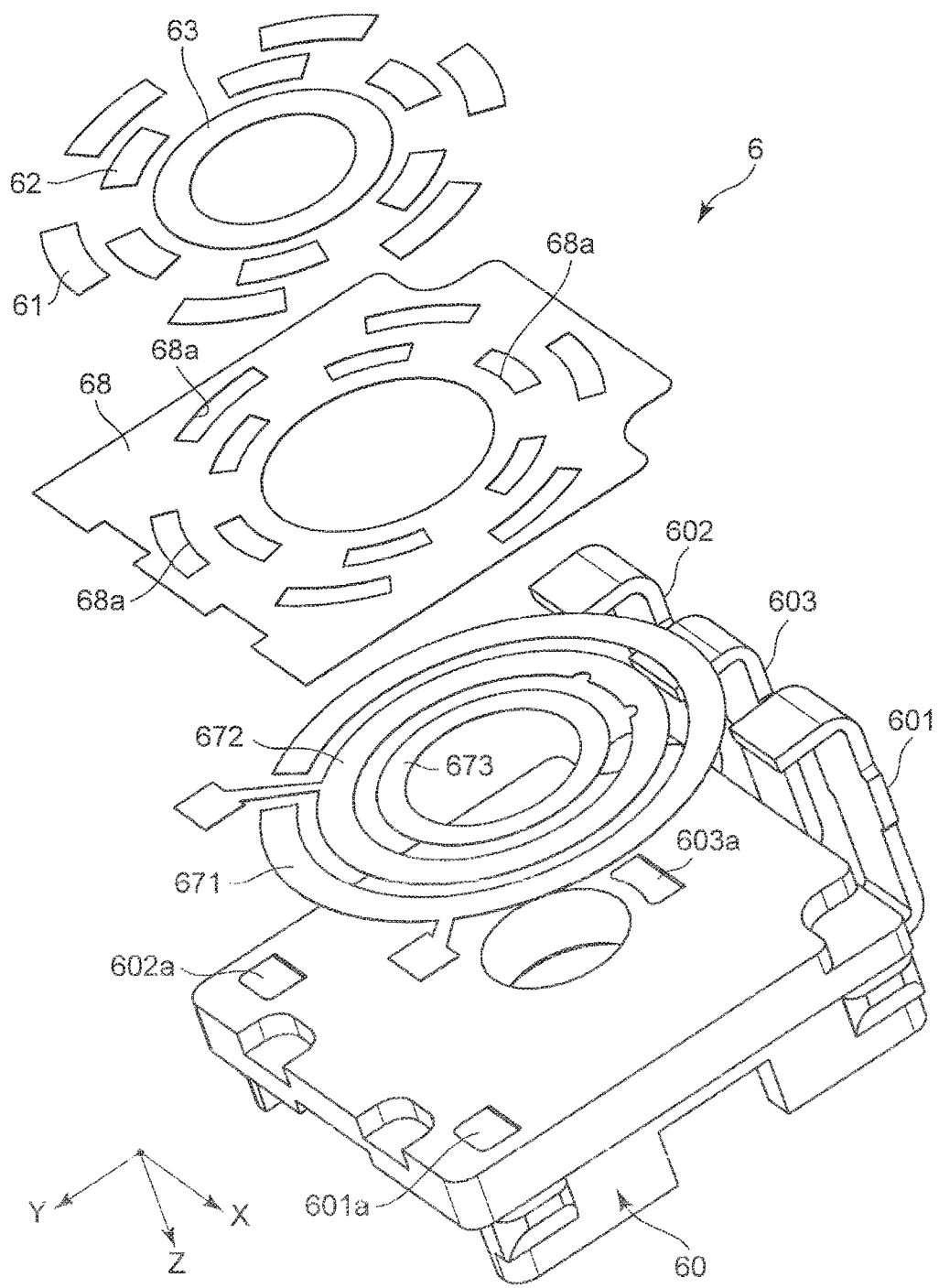
FIG. 3 is an exploded perspective view of the encoder mechanism viewed from the lower side.

FIG. 3 is an exploded perspective view of the encoder mechanism 6 viewed from the lower side. As shown in FIG. 3, first, second, third electrode portions 671, 672, 673 are disposed on a lower surface of the encoder board 60. The first electrode portion 671, the second electrode portion 672, and the third electrode portion 673 are annularly disposed and concentrically arranged. The first electrode portion 671, the second electrode portion 672, and the third electrode portion 673 are arranged in order from the outside to the inside in the radial direction. The first electrode portion 671 is electrically connected to an end portion 601a of the first encoder terminal 601, the second electrode portion 672 is electrically connected to an end portion 602a of the second encoder terminal 602, and the third electrode portion 673 is electrically connected to an end portion 603a of the third encoder terminal 603.

An insulating sheet 68 is laminated on the first, second, and third electrode portions 671, 672, 673. The insulating sheet 68 covers the first electrode portion 671 and the second electrode portion 672 such that the first electrode portion 671 is intermittently exposed in the circumferential direction and that the second electrode portion 672 is intermittently exposed in the circumferential direction. In particular, the insulating sheet 68 includes a plurality of holes 68a intermittently arranged in the circumferential direction, so that the first electrode portion 671 and the second electrode portion 672 are exposed from the holes 68a of the insulating sheet 68. The third electrode portion 673 is not covered with the insulating sheet 68.

The first resistor pattern 61 is disposed on a portion at which the first electrode portion 671 is exposed from the insulating sheet 68, the second resistor pattern 62 is disposed on a portion at which the second electrode portion 672 is exposed from the insulating sheet 68, and the third resistor pattern 63 is disposed on the third electrode portion 673.

As a result, the first resistor pattern 61 is electrically connected via the first electrode portion 671 to the first encoder terminal 601, the second resistor pattern 62 is electrically connected via the second electrode portion 672 to the second encoder terminal 602, and the third resistor pattern 63 is electrically connected via the third electrode portion 673 to the third encoder terminal 603.

Figure 4:
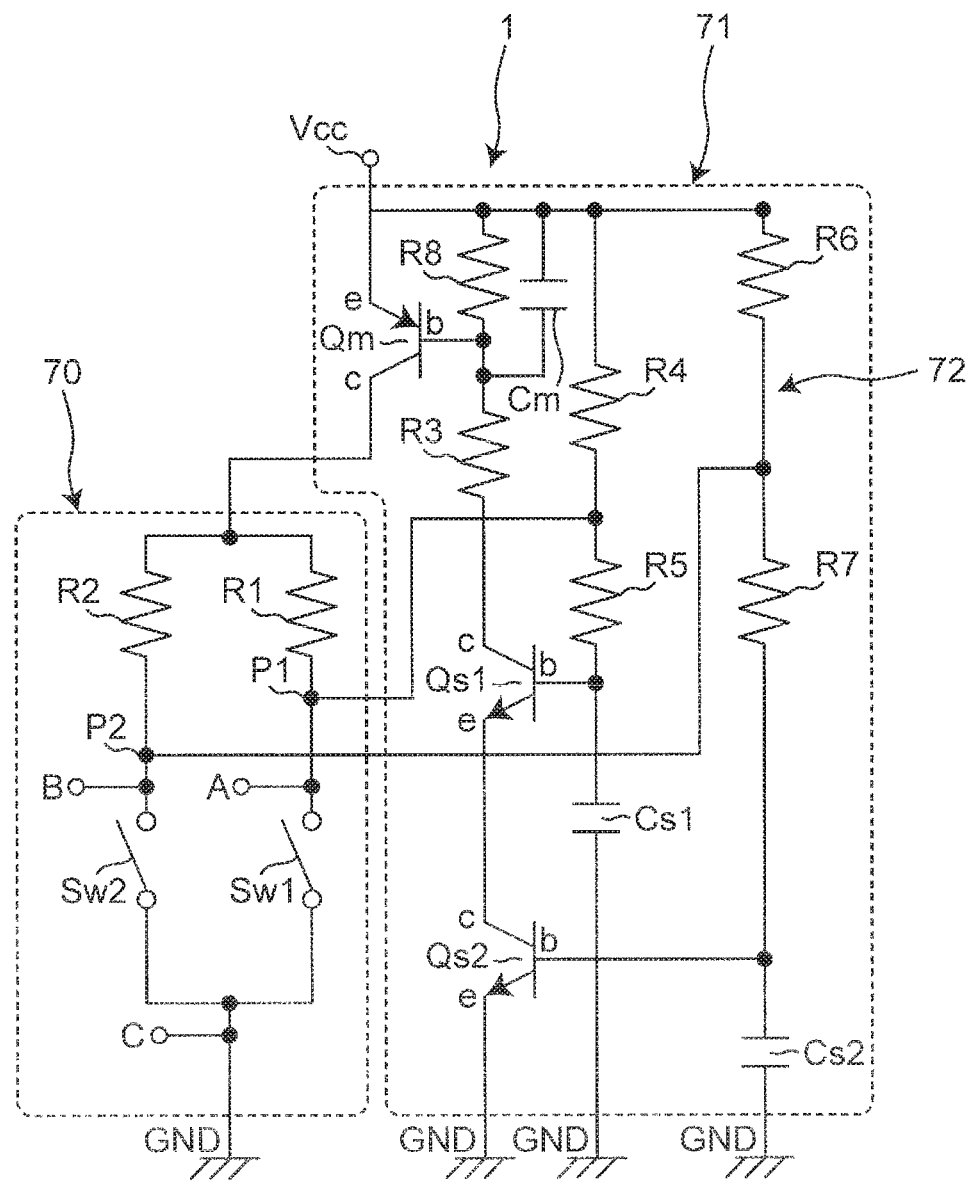
FIG. 4 is a circuit diagram of the encoder.

FIG. 4 is a circuit diagram of the encoder 1. As shown in FIG. 4, the encoder 1 includes an encoder circuit 70 that detects the rotation direction and the rotation angle of the shaft 3 and a control circuit 71 controlling a power supplied to the encoder circuit 70. The encoder circuit 70 is an equivalent circuit of the encoder mechanism 6. The control circuit 71 is included in the control apparatus 7.

The encoder circuit 70 includes first and second switches Sw1, Sw2 opening and closing in accordance with the rotation of the shaft 3 (the slider 66), a first resistor R1 connected in series to the first switch Sw1, and a second resistor R2 connected in series to the second switch Sw2.

The first switch Sw1 and the first resistor R1 and the second switch Sw2 and the second resistor R2 are connected in parallel between a power supply voltage Vcc and a ground GND. The first resistor R1 and the second resistor R2 are located on the power supply voltage Vcc side.

The first switch Sw1 includes the first contact portion 661 and the first resistor pattern 61, and the first contact portion 661 comes into contact with the first resistor pattern 61 to put the first switch Sw1 into a closed state. Similarly, the second switch Sw2 includes the second contact portion 662 and the second resistor pattern 62.

The opening and closing of the first switch Sw1 is determined by detecting an output of a point A between the first switch Sw1 and the first resistor R1 and an output of a point C between the encoder circuit 70 and the ground GND. Similarly, the opening and closing of the second switch Sw2 is determined by detecting an output of a point B between the second switch Sw2 and the second resistor R2 and the output of the point C between the encoder circuit 70 and the ground GND. By determining the opening and closing of the first and second switches Sw1, Sw2, the rotation direction and the rotation amount of the shaft 3 are detected.

Figure 5:
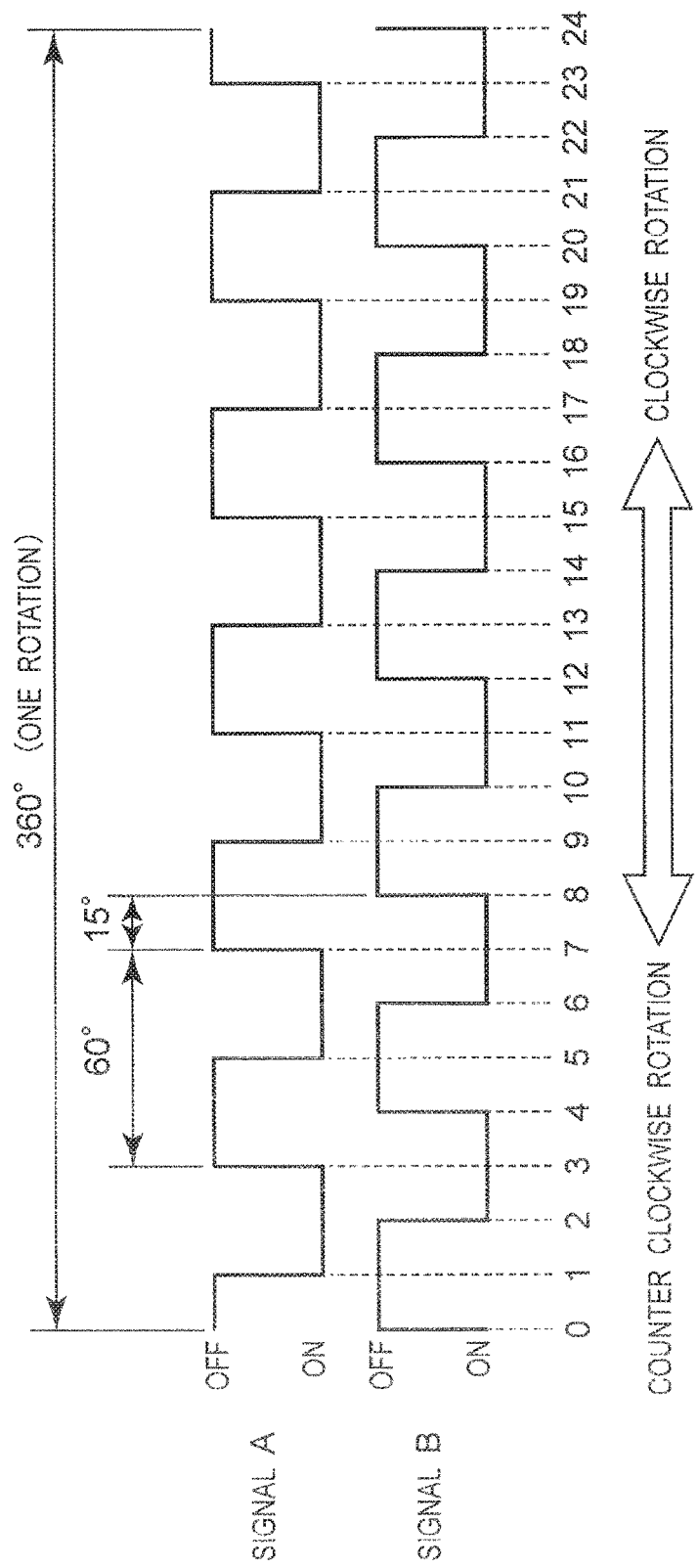
FIG. 5 is a waveform diagram of an output waveform of an encoder circuit.

FIG. 5 is a waveform diagram of an output waveform of the encoder circuit 70. As shown in FIGS. 4 and 5, when the first switch Sw1 is put into the closed state, a current flows between the point A and the point C, and a signal A turns to ON. When the second switch Sw2 is put into the closed state, a current flows between the point B and the point C, and a signal B turns to ON.

In the clockwise rotation of the slider 66, the rotation angle of the slider 66 from the start of OFF to the start of next OFF of the signal A is preferably about 60°, for example. The same applies to the signal B. A gap between the start of OFF of the signal A and the start of OFF of the signal B is preferably about 15°, for example in terms of the rotation angle of the slider 66. In one rotation of the slider 66 (i.e., when the rotation angle of the slider 66 is 360°), the combination of ON and OFF of the signal A and the signal B changes 24 times, for example. In other words, in one rotation of the slider 66, a change in the rotation angle of the slider 66 is preferably determined every 15 degrees, for example. Therefore, by determining the changes in the signal A and the signal B, the rotation direction and the rotation angle of the slider 66 is determined.

As shown in FIG. 4, the control circuit 71 is connected between the first and second resistors R1, R2 and the power supply voltage Vcc to turn off the power supply from the power supply voltage Vcc to the first resistor R1 and the second resistor R2 when at least one of the first and second switches Sw1, Sw2 is closed. As a result, when at least one of the first and second switches Sw1, Sw2 is closed, no current is applied to the first resistor R1 and the second resistor R2, so that no electric power is consumed by the first resistor R1 and the second resistor R2. Particularly, the power consumption is effectively reduced during standby until a certain time elapses after detection of the output of the encoder circuit 70.

The control circuit 71 is connected between a first connection point P1, which is between the first resistor R1 and the first switch Sw1, and the power supply voltage Vcc and is connected between a second connection point P2, which is between the second resistor R2 and the second switch Sw2, and the power supply voltage Vcc, so as to always energize the first connection point P1 and the second connection point P2 from the power supply voltage Vcc. As a result, the outputs of the first and second switches Sw1, Sw2 are able to be detected to determine the opening and closing of the first and second switches Sw1, Sw2. By determining the opening and closing of the first and second switches Sw1, Sw2, the rotation direction and the rotation angle of the shaft 3 are detected.

The control circuit 71 preferably includes a pnp-type main transistor Qm and a main transistor control circuit 72 to control a base current of the main transistor Qm, for example. Therefore, the control circuit 71 has a simple configuration.

The main transistor Qm is preferably a bipolar transistor including an emitter e, a collector c, and a base b, for example. The emitter e is connected to the power supply voltage Vcc, the collector c is connected to the encoder circuit, and the base b is connected to the power supply voltage Vcc.

The main transistor control circuit 72 is connected to the base b of the main transistor Qm and, when at least one of the first and second switches Sw1, Sw2 is closed, the circuit does not apply a current between the emitter e and the base b of the main transistor Qm so as not to apply a current between the emitter e and the collector c of the main transistor Qm.

Specifically, the main transistor control circuit 72 preferably includes an npn-type first sub-transistor Qs1 and an npn-type second sub-transistor Qs2, for example. Therefore, the main transistor control circuit 72 has a simple configuration.

The first sub-transistor Qs1 is preferably a bipolar transistor including an emitter e, a collector c, and a base b, for example. The collector c is connected via the third resistor R3 to the base b of the main transistor Qm and the base b is connected via a series circuit of a fourth resistor R4 and a fifth resistor R5 to the power supply voltage Vcc.

The second sub-transistor Qs2 is preferably a bipolar transistor including an emitter e, a collector c, and a base b, for example. The collector c is connected to the emitter e of the first sub-transistor Qs1, the emitter e is connected to the ground GND, and the base b is connected via a series circuit of a sixth resistor R6 and a seventh resistor R7 to the power supply voltage Vcc.

The first connection point P1 of the encoder circuit 70 is connected between the fourth resistor R4 and the fifth resistor R5. The second connection point P2 of the encoder circuit 70 is connected between the sixth resistor R6 and the seventh resistor R7.

The first and second sub-transistors Qs1, Qs2 control the base current of the main transistor Qm.

The fourth and sixth resistors R4, R6 are larger than the first and second resistors R1, R2. Therefore, the electric power consumed by the fourth and sixth resistors R4, R6 is smaller than the electric power consumed by the first and second resistors R1, R2. Thus, when at least one of the first and second switches Sw1, Sw2 is closed, the electric power consumed between the power supply voltage Vcc and the ground GND is reduced.

The fifth and seventh resistors R5, R7 ensure the output of the encoder circuit 70 (i.e., the outputs of the points A, B, and C). The fifth and seventh resistors R5, R7 are larger than the first and second resistors R1, R2.

An eighth resistor R8 is connected between the base b of the main transistor Qm and the power supply voltage Vcc. Therefore, the noise of the base b of the main transistor Qm is removed.

A main capacitor Cm is connected between the base b of the main transistor Qm and the power supply voltage Vcc in parallel with the eighth resistor R8. The base current of the main transistor Qm is stabilized by the main capacitor Cm.

The base b of the first sub-transistor Qs1 is connected via a first sub-capacitor Cs1 to the ground GND. The base current of the first sub-transistor Qs1 is stabilized by the first sub-capacitor Cs1.

The base b of the second sub-transistor Qs2 is connected via the second sub-capacitor Cs2 to the ground GND. The base current of the second sub-transistor Qs2 is stabilized by the second sub-capacitor Cs2.

The operation of the control circuit 71 will be described with reference to FIGS. 4 and 6.

First, a description will be provided of the case in which the first and second switches Sw1, Sw2 are in the opened state.

The current from the power supply voltage Vcc passes through the fourth and fifth resistors R4, R5 and flows between the base b and the emitter e of the first sub-transistor Qs1, and the first sub-transistor Qs1 is turned on. As a result, a current flows between the collector c and the emitter e of the first sub-transistor Qs1.

The current from the power supply voltage Vcc passes through the sixth and seventh resistors R6, R7 and flows between the base b and the emitter e of the second sub-transistor Qs2, and the second sub-transistor Qs2 is turned on. As a result, a current flows between the collector c and the emitter e of the second sub-transistor Qs2.

Therefore, a current flows between the emitter e and the base b of the main transistor Qm, and the main transistor Qm is turned on. Thus, a current flows between the emitter e and the collector c of the main transistor Qm, and the main transistor Qm supplies power from the power supply voltage Vcc to the first and second resistors R1, R2 to give an output to the points A and B.

Second, a description will be provided of the case in which the first switch Sw1 is in the closed state while the second switch Sw2 is in the opened state.

The current from the power supply voltage Vcc flows through the fourth resistor R4, the first connection point P1, and the first switch Sw1 to the ground GND, and no current flows between the base b and the emitter e of the first sub-transistor Qs1. As a result, the first sub-transistor Qs1 is turned off.

The current from the power supply voltage Vcc passes through the sixth and seventh resistors R6, R7 and flows between the base b and the emitter e of the second sub-transistor Qs2. As a result, the second sub-transistor Qs2 is turned on. The current from the power supply voltage Vcc flows through the sixth resistor R6 to the second connection point P2 to give an output to the point B.

Therefore, no current flows between the emitter e and the base b of the main transistor Qm, and the main transistor Qm is turned off. Thus, no current flows between the emitter e and the collector c of the main transistor Qm, and the main transistor Qm does not supply power from the power supply voltage Vcc to the first and second resistors R1, R2.

Third, a description will be provided of the case in which the first switch Sw1 is in the opened state while the second switch Sw2 is in the closed state.

The current from the power supply voltage Vcc passes through the fourth and fifth resistors R4, R5 and flows between the base b and the emitter e of the first sub-transistor Qs1. As a result, the first sub-transistor Qs1 is turned on. The current from the power supply voltage Vcc flows through the fourth resistor R4 to the first connection point P1 to give an output to the point A.

The current from the power supply voltage Vcc flows through the sixth resistor R6, the second connection point P2, and the second switch Sw2 to the ground GND, and no current flows between the base b and the emitter e of the second sub-transistor Qs2. As a result, the second sub-transistor Qs2 is turned off.

Therefore, no current flows between the emitter e and the base b of the main transistor Qm, and the main transistor Qm is turned off. Thus, no current flows between the emitter e and the collector c of the main transistor Qm, and the main transistor Qm does not supply power from the power supply voltage Vcc to the first and second resistors R1, R2.

Fourth, a description will be provided of the case in which the first switch Sw1 is in the closed state while the second switch Sw2 is in the closed state.

The current from the power supply voltage Vcc flows through the fourth resistor R4, the first connection point P1, and the first switch Sw1 to the ground GND, and no current flows between the base b and the emitter e of the first sub-transistor Qs1. As a result, the first sub-transistor Qs1 is turned off.

The current from the power supply voltage Vcc flows through the sixth resistor R6, the second connection point P2, and the second switch Sw2 to the ground GND, and no current flows between the base b and the emitter e of the second sub-transistor Qs2. As a result, the second sub-transistor Qs2 is turned off.

Therefore, no current flows between the emitter e and the base b of the main transistor Qm, and the main transistor Qm is turned off. Thus, no current flows between the emitter e and the collector c of the main transistor Qm, and the main transistor Qm does not supply power from the power supply voltage Vcc to the first and second resistors R1, R2.

As described above, when at least one of the first and second switches Sw1, Sw2 is closed, no current is applied to the first resistor R1 and the second resistor R2, so that no electric power is consumed by the first resistor R1 and the second resistor R2. Therefore, the electric power consumed between the power supply voltage Vcc and the ground GND is reduced.

A non-limiting example of a preferred embodiment of the present invention will be described below.

As shown in FIG. 7A, the first and second resistors R1, R2 are set to about 100 kΩ; the third and eighth resistors R3, R8 are set to about 1 MΩ; the fourth and sixth resistors R4, R6 are set to about 1 MΩ or about 2.2 MΩ or about 5.1 MΩ; and the fifth and seventh resistors R5, R7 are set to about 7.5 MΩ. The main capacitor Cm, the first sub-capacitor Cs1, and the second sub-capacitor Cs2 are open. The power supply voltage Vcc is set to about 5 V.

Figure 11:
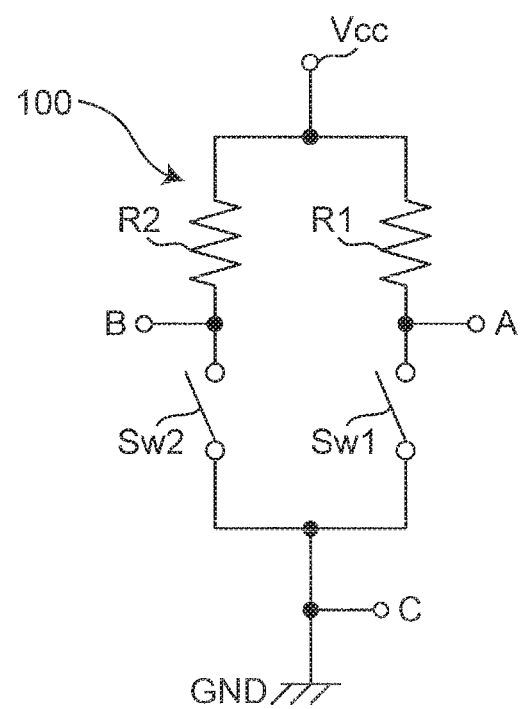
FIG. 11 is a circuit diagram of a conventional encoder.

FIG. 7B shows a consumption current [μA] between the power supply voltage Vcc and the ground GND of the present example of a preferred embodiment of the present invention and a conventional example corresponding to the opening and closing states of the first and second switches Sw1, Sw2. The present example shows the consumption current [μA] when the fourth and sixth resistors R4, R6 are about 1 MΩ or about 2.2 MΩ or about 5.1 MΩ. The comparative example shows the consumption current [μA] in FIG. 11.

As shown in FIG. 7B, when at least one of the first and second switches Sw1, Sw2 is in the closed state, the consumption current of the present example is smaller than the consumption current of the conventional example. In the present example, when the fourth and sixth resistors R4, R6 are larger, the consumption current becomes smaller.

Second Preferred Embodiment

Figure 8:
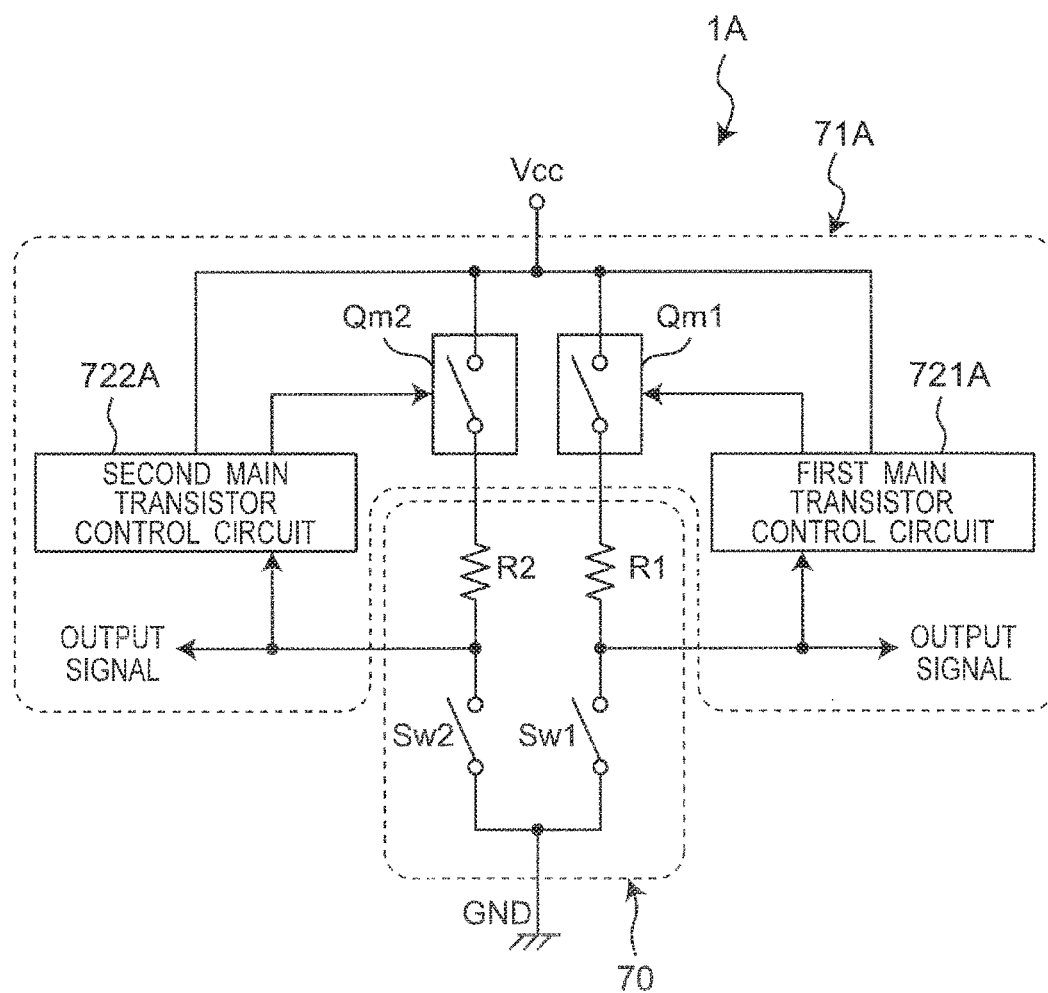
FIG. 8 is a schematic configuration diagram of an encoder of a second preferred embodiment of the present invention.

FIG. 8 is a schematic configuration diagram of an encoder of a second preferred embodiment of the present invention. As shown in FIG. 8, an encoder 1A includes an encoder circuit 70 and a control circuit 71A controlling the power supplied to the encoder circuit 70. In the second preferred embodiment, the same components and elements as the first preferred embodiment are denoted by the same reference numerals as the first preferred embodiment and therefore will not be described.

The encoder circuit 70 is configured by connecting the first switch Sw1 and the first resistor R1 and the second switch Sw2 and the second resistor R2 between the power supply voltage Vcc and the ground GND such that the first and second resistors R1, R2 are located on the power supply voltage Vcc side.

The control circuit 71A is connected between the first and second resistors R1, R2 and the power supply voltage Vcc to turn off the power supply from power supply voltage Vcc to the first resistor R1 when the first switch Sw1 is closed and to turn off the power supply from power supply voltage Vcc to the second resistor R2 when the second switch Sw2 is closed. As a result, when the first switch Sw1 is closed, no current is applied to the first resistor R1, so that no electric power is consumed by the first resistor R1. When the second switch Sw2 is closed, no current is applied to the second resistor R2, so that no electric power is consumed by the second resistor R2. Particularly, the power consumption is effectively reduced during standby until a certain time elapses after detection of the output of the encoder circuit 70.

The control circuit 71A is connected between the first connection point P1, which is between the first resistor R1 and the first switch Sw1, and the power supply voltage Vcc and is connected between the second connection point P2, which is between the second resistor R2 and the second switch Sw2, and the power supply voltage Vcc, so as to always energize the first connection point P1 and the second connection point P2 from the power supply voltage Vcc. As a result, the outputs of the first and second switches Sw1, Sw2 are able to be detected to determine the opening and closing of the first and second switches Sw1, Sw2. By determining the opening and closing of the first and second switches Sw1, Sw2, the rotation direction and the rotation angle of the shaft 3 are detected.

The control circuit 71A includes a first main transistor Qm1, a second main transistor Qm2, a first main transistor control circuit 721A controlling turning-on/off the current of the first main transistor Qm1, a second main transistor control circuit 722A controlling turning-on/off of the current of the second main transistor Qm2. Therefore, the control circuit 71A has a simple configuration.

Figure 9:
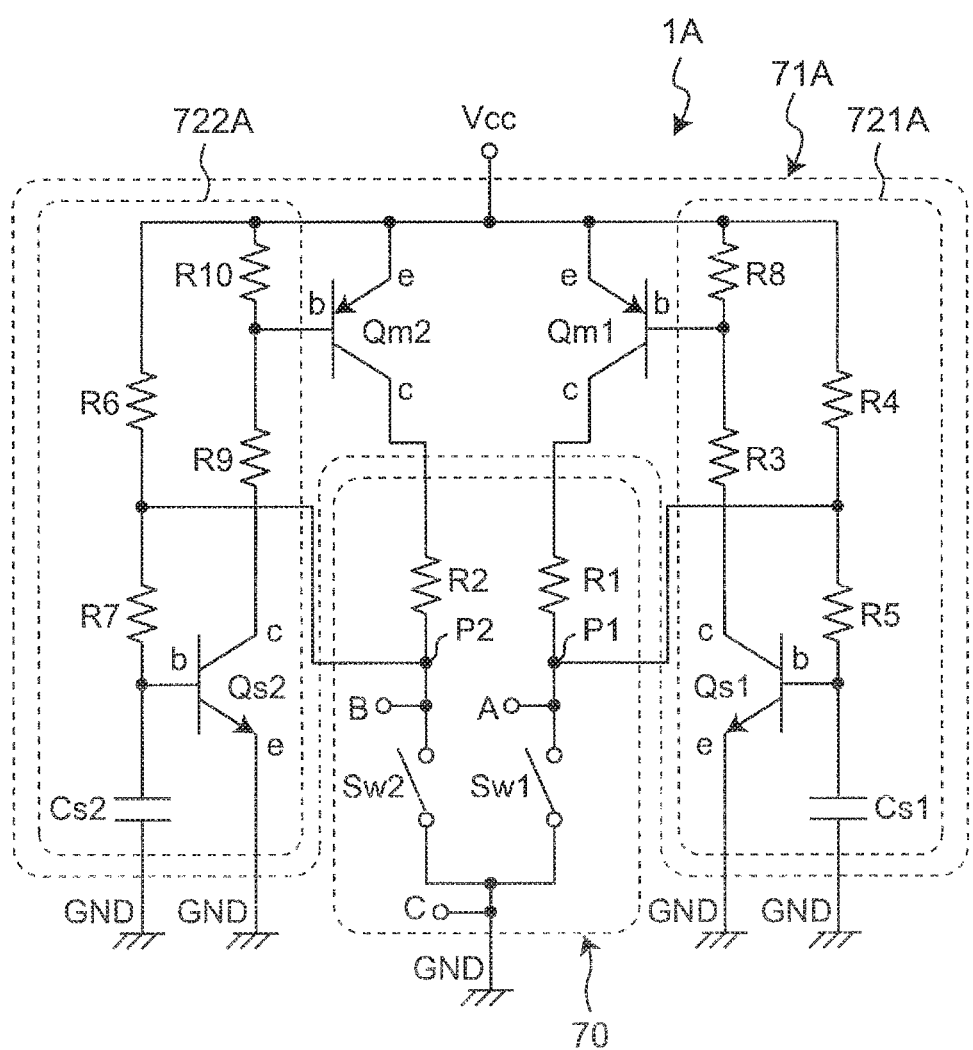
FIG. 9 is a circuit diagram of the encoder.

FIG. 9 is a circuit diagram of the encoder of the second preferred embodiment of the present invention. As shown in FIG. 9, the first main transistor Qm1 is preferably a bipolar transistor including an emitter e, a collector c, and a base bm, for example. The emitter e is connected to the power supply voltage Vcc, the collector c is connected to the first resistor R1 of the encoder circuit 70, and the base b is connected to the power supply voltage Vcc.

The first main transistor control circuit 721A is connected to the base b of the first main transistor Qm1 and, when the first switch Sw1 is closed, the circuit does not apply a current between the emitter e and the base b of the first main transistor Qm1 so as not to apply a current between the emitter e and the collector c of the first main transistor Qm1. Therefore, the first sub-transistor Qs1 controls the base current of the first main transistor Qm1.

Specifically, the first main transistor control circuit 721A preferably includes the npn-type first sub-transistor Qs1, for example. Therefore, the first main transistor control circuit 721A has a simple configuration.

The first sub-transistor Qs1 is preferably a bipolar transistor including an emitter e, a collector c, and a base b, for example. The collector c is connected via the third resistor R3 to the base b of the first main transistor Qm1, the emitter e is connected to the ground GND, and the base b is connected voltage Vcc via a series circuit of the fourth resistor R4 and the fifth resistor R5 to the power supply.

The first connection point P1 of the encoder circuit 70 is connected between the fourth resistor R4 and the fifth resistor R5. The fourth resistor R4 is larger than the first resistor R1. Therefore, the electric power consumed by the fourth resistor R4 is smaller than the electric power consumed by the first resistor R1. Thus, when the first switch Sw1 is closed, the electric power consumed between the power supply voltage Vcc and ground GND is reduced.

The fifth resistor R5 ensures the output of the encoder circuit 70 (i.e., the output signal of the point A). The fifth resistor R5 is larger than the first resistor R1.

The eighth resistor R8 is connected between the base b of the first main transistor Qm1 and the power supply voltage Vcc. Therefore, the noise of the base b of the first main transistor Qm1 is removed.

The base b of the first sub-transistor Qs1 is connected via the first sub-capacitor Cs1 to the ground GND. The base current of the first sub-transistor Qs1 is stabilized by the first sub-capacitor Cs1.

The second Main transistor Qm2 is preferably a bipolar transistor including an emitter e, a collector c, and a base b, for example. The emitter e is connected to the power supply voltage Vcc, the collector c is connected to the second resistor R2 of the encoder circuit 70, and the base b is connected to the power supply voltage Vcc.

The second main transistor control circuit 722A is connected to the base b of the second main transistor Qm2 and, when the second switch Sw2 is closed, the circuit does not apply a current between the emitter e and the base b of the second main transistor Qm2 so as not to apply a current between the emitter e and the collector c of the second main transistor Qm2. Therefore, the second sub-transistor Qs2 controls the base current of the second main transistor Qm2.

Specifically, the second main transistor control circuit 722A preferably includes the npn-type second sub-transistor Qs2, for example. Therefore, the second main transistor control circuit 722A has a simple configuration.

The second sub-transistor Qs2 is preferably a bipolar transistor including an emitter e, a collector c, and a base b, for example. The collector c is connected via a ninth resistor R9 to the base b of the second main transistor Qm2, the emitter e is connected to the ground GND, and the base b is connected via a series circuit of the sixth resistor R6 and the seventh resistor R7 to the power supply voltage Vcc.

The second connection point P2 of the encoder circuit 70 is connected between the sixth resistor R6 and the seventh resistor R7. The sixth resistor R6 is larger than the second resistor R2. Therefore, the electric power consumed by the sixth resistor R6 is smaller than the electric power consumed by the second resistor R2. Thus, when the second switch Sw2 is closed, the electric power consumed between the power supply voltage Vcc and ground GND is reduced.

The seventh resistor R7 ensures the output of the encoder circuit 70 (i.e., the output signal of the point B). The seventh resistor R7 is larger than the second resistor R2.

A tenth resistor R10 is connected between the base b of the second main transistor Qm2 and the power supply voltage Vcc. Therefore, the noise of the base b of the second main transistor Qm2 is removed.

The base b of the second sub-transistor Qs2 is connected via the second sub-capacitor Cs2 to the ground GND. The base current of the second sub-transistor Qs2 is stabilized by the second sub-capacitor Cs2.

The operation of the control circuit 71A will be described with reference to FIGS. 9 and 10.

First, a description will be provided of the case in which the first and second switches Sw1, Sw2 are in the opened state.

The current from the power supply voltage Vcc passes through the fourth and fifth resistors R4, R5 and flows between the base b and the emitter e of the first sub-transistor Qs1, and the first sub-transistor Qs1 is turned on. As a result, a current flows between the collector c and the emitter e of the first sub-transistor Qs1.

Therefore, a current flows between the emitter e and the base b of the first main transistor Qm1, and the first main transistor Qm1 is turned on. Thus, a current flows between the emitter e and the collector c of the first main transistor Qm1, and the first main transistor Qm1 supplies power from the power supply voltage Vcc to the first resistor R1 to give an output to the point A.

On the other hand, the current from the power supply voltage Vcc passes through the sixth and seventh resistors R6, R7 and flows between the base b and the emitter e of the second sub-transistor Qs2, and the second sub-transistor Qs2 is turned on. As a result, a current flows between the collector c and the emitter e of the second sub-transistor Qs2.

Therefore, a current flows between the emitter e and the base b of the second main transistor Qm2, and the second main transistor Qm2 is turned on. Thus, a current flows between the emitter e and the collector c of the second main transistor Qm2, and the second main transistor Qm2 supplies power from the power supply voltage Vcc to the second resistor R2 to give an output to the point B.

Second, a description will be provided of the case in which the first switch Sw1 is in the closed state while the second switch Sw2 is in the opened state.

The current from the power supply voltage Vcc flows through the fourth resistor R4, the first connection point P1, and the first switch Sw1 to the ground GND, and no current flows between the base b and the emitter e of the first sub-transistor Qs1. As a result, the first sub-transistor Qs1 is turned off.

Therefore, no current flows between the emitter e and the base b of the first main transistor Qm1, and the first main transistor Qm1 is turned off. Thus, no current flows between the emitter e and the collector c of the first main transistor Qm1, and the first main transistor Qm1 does not supply power from the power supply voltage Vcc to the first resistor R1.

On the other hand, the current from the power supply voltage Vcc passes through the sixth and seventh resistors R6, R7 and flows between the base b and the emitter e of the second sub-transistor Qs2, and the second sub-transistor Qs2 is turned on. As a result, a current flows between the collector c and the emitter e of the second sub-transistor Qs2.

Therefore, a current flows between the emitter e and the base b of the second main transistor Qm2, and the second main transistor Qm2 is turned on. Thus, a current flows between the emitter e and the collector c of the second main transistor Qm2, and the second main transistor Qm2 supplies power from the power supply voltage Vcc to the second resistor R2 to give an output to the point B.

Third, a description will be provided of the case in which the first switch Sw1 is in the opened state while the second switch Sw2 is in the closed state.

The current from the power supply voltage Vcc passes through the fourth and fifth resistors R4, R5 and flows between the base b and the emitter e of the first sub-transistor Qs1, and the first sub-transistor Qs1 is turned on. As a result, a current flows between the collector c and the emitter e of the first sub-transistor Qs1.

Therefore, a current flows between the emitter e and the base b of the first main transistor Qm1, and the first main transistor Qm1 is turned on. Thus, a current flows between the emitter e and the collector c of the first main transistor Qm1, and the first main transistor Qm1 supplies power from the power supply voltage Vcc to the first resistor R1 to give an output to the point A.

On the other hand, the current from the power supply voltage Vcc flows through the sixth resistor R6, the second connection point P2, and the second switch Sw2 to the ground GND, and no current flows between the base b and the emitter e of the second sub-transistor Qs2. As a result, the second sub-transistor Qs2 is turned off.

Therefore, no current flows between the emitter e and the base b of the second main transistor Qm2, and the second main transistor Qm2 is turned off. Thus, no current flows between the emitter e and the collector c of the second main transistor Qm2, and the second main transistor Qm2 does not supply power from the power supply voltage Vcc to the second resistor R2.

Fourth, a description will be provided of the case in which the first switch Sw1 is in the closed state while the second switch Sw2 is in the closed state.

The current from the power supply voltage Vcc flows through the fourth resistor R4, the first connection point P1, and the first switch Sw1 to the ground GND, and no current flows between the base b and the emitter e of the first sub-transistor Qs1. As a result, the first sub-transistor Qs1 is turned off.

Therefore, no current flows between the emitter e and the base b of the first main transistor Qm1, and the first main transistor Qm1 is turned off. Thus, no current flows between the emitter e and the collector c of the first main transistor Qm1, and the first main transistor Qm1 does not supply power from the power supply voltage Vcc to the first resistor R1.

The current from the power supply voltage Vcc flows through the sixth resistor R6, the second connection point P2, and the second switch Sw2 to the ground GND, and no current flows between the base b and the emitter e of the second sub-transistor Qs2. As a result, the second sub-transistor Qs2 is turned off.

Therefore, no current flows between the emitter e and the base b of the second main transistor Qm2, and the second main transistor Qm2 is turned off. Thus, no current flows between the emitter e and the collector c of the second main transistor Qm2, and the second main transistor Qm2 does not supply power from the power supply voltage Vcc to the second resistor R2.

As described above, when the first switch Sw1 is closed, no current is applied to the first resistor R1, so that no electric power is consumed by the first resistor R1. When second switch Sw2 is closed, no current is applied to the second resistor R2, so that not electric power is consumed by the second resistor R2. Therefore, the electric power consumed between the power supply voltage Vcc and the ground GND is reduced.

The present invention is not limited to the preferred embodiments described above and may be changed in design without departing from the spirit of the present invention.

Although the main transistor and the first and second main transistors are preferably the pnp type in the preferred embodiments, the transistors may be the npn type. Although the first and second sub-transistors are preferably the npn type, the sub-transistors may be the pnp type.

Although bipolar transistors are preferably used for the main transistor, the first and second main transistors, and first and second sub-transistors in the preferred embodiments, FETs (field effect transistors) may be used.

Although the eighth and tenth resistors are preferably provided in the preferred embodiments, the eighth and tenth resistors may not be included.

Although a capacitor is preferably connected to the base of each of the main transistor, the first sub-transistor, and the second sub-transistor in the preferred embodiments, a capacitor may be connected to a base of at least one of the main transistor, the first sub-transistor, and the second sub-transistor. Alternatively, the capacitor may not be included.

Although a rotary encoder is preferably used as the encoder in the preferred embodiments, a linear encoder may be used. The linear encoder detects a movement direction and a movement amount of a second member movable with respect to a first member.

Although a transistor is preferably used to turn off the power supply to the first and second resistors of the encoder circuit in the preferred embodiments, a mechanical switch mechanism may be used.

Although transistors are preferably used for the main transistor control circuit and the first and second main transistor control circuits in the preferred embodiments, a logic circuit such as a microcomputer may be used.

Although the encoder circuit including the two switches is preferably controlled by the control circuit in the preferred embodiments, a circuit including one switch may be controlled. In other words, a circuit including one switch and one resistor connected in series may be controlled by the control circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An encoder for detecting a movement direction and a movement amount of a second member movable with respect to a first member, comprising:
    an encoder circuit including first and second switches opening and closing in accordance with the movement of the second member, a first resistor connected in series to the first switch, and a second resistor connected in series to the second switch, the encoder circuit being defined by the first switch and the first resistor and the second switch and the second resistor being connected between a power supply voltage and a ground such that the first and second resistors are located on the power supply voltage side; and
    a control circuit connected between the first and second resistors and the power supply voltage to turn off power supply from the power supply voltage to the first resistor when the first switch is closed and to turn off power supply from the power supply voltage to the second resistor when the second switch is closed; wherein
    the control circuit is connected to a first connection point between the first resistor and the first switch and is connected to a second connection point between the second resistor and the second switch to always energize the first and second connection points from the power supply voltage.

2. The encoder according to claim 1, wherein
    the encoder circuit is defined by the first switch and the first resistor and the second switch and the second resistor being connected in parallel between the power supply voltage and the ground; and
    the control circuit turns off power supply from the power supply voltage to the first and second resistors when at least one of the first and second switches is closed.

3. The encoder according to claim 2, wherein the control circuit includes:
a pnp-type main transistor including an emitter connected to the power supply voltage, a collector connected to the encoder circuit, and a base connected to the power supply voltage; and
a main transistor control circuit connected to the base of the main transistor and applying no current between the emitter and the base of the main transistor so as not to apply a current between the emitter and the collector of the main transistor when at least one of the first and second switches is closed.

4. The encoder according to claim 3, wherein the main transistor control circuit includes:
an npn-type first sub-transistor including a collector connected via a third resistor to the base of the main transistor and a base connected via a series circuit of a fourth resistor and a fifth resistor to the power supply voltage; and
an npn-type second sub-transistor including a collector connected to the emitter of the first sub-transistor, an emitter connected to the ground, and a base connected via a series circuit of a sixth resistor and a seventh resistor to the power supply voltage; and
the first connection point of the encoder circuit is connected between the fourth resistor and the fifth resistor, and the second connection point of the encoder circuit is connected between the sixth resistor and the seventh resistor.

5. The encoder according to claim 4, wherein an eighth resistor is connected between the base of the main transistor and the power supply voltage.

6. The encoder according to claim 4, wherein a capacitor is connected to at least one of the base of the main transistor, the base of the first sub-transistor, and the base of the second sub-transistor.

7. The encoder according to claim 1, wherein the control circuit includes:
a pnp-type first main transistor including an emitter connected to the power supply voltage, a collector connected to the first resistor of the encoder circuit, and a base connected to the power supply voltage;
a pnp-type second main transistor including an emitter connected to the power supply voltage, a collector connected to the second resistor of the encoder circuit, and a base connected to the power supply voltage;
a first main transistor control circuit connected to the base of the first main transistor and applying no current between the emitter and the base of the first main transistor so as not to apply a current between the emitter and the collector of the first main transistor when the first switch is closed; and
a second main transistor control circuit connected to the base of the second main transistor and applying no current between the emitter and the base of the second main transistor so as not to apply a current between the emitter and the collector of the second main transistor when the second switch is closed.

8. The encoder according to claim 7, wherein
the first main transistor control circuit includes an npn-type first sub-transistor including a collector connected via a third resistor to the base of the first main transistor, an emitter connected to the ground, and a base connected via a series circuit of a fourth resistor and a fifth resistor to the power supply voltage;
the second main transistor control circuit includes an npn-type second sub-transistor including a collector connected via a ninth resistor to the base of the second main transistor, an emitter connected to the ground, and a base connected via a series circuit of a sixth resistor and a seventh resistor to the power supply voltage; and
the first connection point of the encoder circuit is connected between the fourth resistor and the fifth resistor, and the second connection point of the encoder circuit is connected between the sixth resistor and the seventh resistor.

9. The encoder according to claim 8, wherein
an eighth resistor is connected between the base of the first main transistor and the power supply voltage; and
a tenth resistor is connected between the base of the second main transistor and the power supply voltage.

10. The encoder according to claim 8, wherein a capacitor is connected to at least one of the base of the first sub-transistor and the base of the second sub-transistor.

11. The encoder according to claim 1, further comprising:
a casing, a shaft attached to the casing so as to be rotatable around an axis, an encoder mechanism including the encoder circuit, and a control apparatus including the control circuit.

12. The encoder according to claim 11, wherein the casing is made of metal, integrally assembles the shaft, the encoder mechanism, and the control apparatus, and the casing includes a bottom wall and a box-shaped lid body attached to the bottom wall.

13. The encoder according to claim 12, wherein
the shaft is made of resin and includes an operation portion and a shaft portion;
the operation portion and the shaft portion are arranged along the axis from an upper side to a lower side of the casing; and
the operation portion penetrates the lid body of the casing such that a user can operate the operation portion from outside of the casing.

14. The encoder according to claim 12, wherein the encoder mechanism includes an encoder board on which at least a portion of the encoder circuit is provided.

15. The encoder according to claim 12, wherein the encoder board is disposed in the casing and fixed to the lid body of the casing.

* * * * *